(12) United States Patent
Murakami et al.

(10) Patent No.: US 11,043,392 B2
(45) Date of Patent: Jun. 22, 2021

(54) METHOD OF MANUFACTURING SEMICONDUCTOR DEVICE, SUBSTRATE PROCESSING APPARATUS AND RECORDING MEDIUM

(71) Applicant: KOKUSAI ELECTRIC CORPORATION, Tokyo (JP)

(72) Inventors: Kotaro Murakami, Toyama (JP); Naoharu Nakaiso, Toyama (JP); Tetsuya Takahashi, Toyama (JP); Atsushi Moriya, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/298,241

(22) Filed: Mar. 11, 2019

(65) Prior Publication Data

US 2019/0279877 A1    Sep. 12, 2019

(30) Foreign Application Priority Data

Mar. 12, 2018    (JP) .............................. JP2018-044378

(51) Int. Cl.
*H01L 21/311*    (2006.01)
*C23C 16/52*     (2006.01)
(Continued)

(52) U.S. Cl.
CPC .... *H01L 21/31116* (2013.01); *C23C 16/4405* (2013.01); *C23C 16/52* (2013.01);
(Continued)

(58) Field of Classification Search
CPC ......... H01L 21/31116; H01L 21/02167; H01L 21/32055; H01L 21/32135; C23C 16/4405; C23C 16/52
See application file for complete search history.

(56) References Cited

U.S. PATENT DOCUMENTS 4,880,514 A * 11/1989 Scott ................. G11B 5/64
                                              204/192.2
7,807,019 B2 * 10/2010 Ishii .................. H01J 37/3222
                                              156/345.41
(Continued)

FOREIGN PATENT DOCUMENTS

JP    2003-218036 A    7/2003
JP    2003-218037 A    7/2003
(Continued)

OTHER PUBLICATIONS

Japanese Office Action dated Jul. 14, 2020 for Japanese Patent Application No. 2018-044378.

(Continued)

*Primary Examiner* — Anita K Alanko
(74) *Attorney, Agent, or Firm* — Volpe Koenig

(57) ABSTRACT

There is provided a technique that includes partially etching a film formed on a surface of a substrate by performing a cycle a predetermined number of times, the cycle including: (a) setting a temperature of the substrate having the first film formed on the surface to a first temperature; (b) stabilizing an in-plane temperature of the substrate at the first temperature; and (c) lowering the temperature of the substrate having the in-plane temperature stabilized at the first temperature from the first temperature to a second temperature that is lower than the first temperature, wherein in (c), an etching gas is supplied to the substrate for a predetermined period.

17 Claims, 7 Drawing Sheets

(51) Int. Cl.
*C23C 16/44* (2006.01)
*H01L 21/02* (2006.01)
*H01L 21/3213* (2006.01)
*H01L 21/3205* (2006.01)

(52) U.S. Cl.
CPC .. *H01L 21/02167* (2013.01); *H01L 21/32055* (2013.01); *H01L 21/32135* (2013.01)

(56) References Cited

U.S. PATENT DOCUMENTS

| | | | |
|---|---|---|---|
| 9,773,520 B2* | 9/2017 | Yang | G03F 7/0002 |
| 2003/0139012 A1 | 7/2003 | Yamauchi et al. | |
| 2008/0268644 A1 | 10/2008 | Kameda et al. | |
| 2009/0042404 A1* | 2/2009 | Surthi | C23C 16/45578 |
| | | | 438/770 |
| 2012/0247391 A1 | 10/2012 | Endo et al. | |
| 2012/0267341 A1 | 10/2012 | Kato et al. | |
| 2013/0092656 A1* | 4/2013 | Doan | H01L 21/31116 |
| | | | 216/67 |
| 2013/0137272 A1* | 5/2013 | Ishibashi | H01L 21/3065 |
| | | | 438/706 |
| 2014/0370717 A1* | 12/2014 | Chakrapani | H01L 21/67103 |
| | | | 438/725 |
| 2015/0011091 A1 | 1/2015 | Takenaga et al. | |
| 2015/0147873 A1* | 5/2015 | Moriya | H01L 21/02658 |
| | | | 438/492 |
| 2018/0204732 A1 | 7/2018 | Kamakura et al. | |
| 2019/0276938 A1* | 9/2019 | Sugishita | C23C 16/52 |

FOREIGN PATENT DOCUMENTS

| | | |
|---|---|---|
| JP | 2008-218984 A | 9/2008 |
| JP | 2012-209394 A | 10/2012 |
| JP | 2012-212819 A | 11/2012 |
| JP | 2015-015315 A | 1/2015 |
| WO | 2012/026241 A1 | 3/2012 |
| WO | 2017/046921 A1 | 3/2017 |

OTHER PUBLICATIONS

Japanese Office Action dated Oct. 13, 2020 for Japanese Patent Application No. 2018-044378.

* cited by examiner

FIG. 6A

|  | TOP | CEN | BTM |
|---|---|---|---|
| WiW(±%) | 6.9 | 6.5 | 8.5 |
| WtW (±%) | 2.97 | | |

FIG. 6B

|  | TOP | CEN | BTM |
|---|---|---|---|
| WiW(±%) | 8.4 | 8.1 | 9.5 |
| WtW (±%) | 26.5 | | |

METHOD OF MANUFACTURING SEMICONDUCTOR DEVICE, SUBSTRATE PROCESSING APPARATUS AND RECORDING MEDIUM

CROSS-REFERENCE TO RELATED APPLICATION

This application is based upon and claims the benefit of priority from Japanese Patent Application No. 2018-044378, filed on Mar. 12, 2018, the entire contents of which are incorporated herein by reference.

TECHNICAL FIELD

The present disclosure relates to a method of manufacturing a semiconductor device, a substrate processing apparatus and a recording medium.

BACKGROUND

A process of etching a part of a film formed on the surface of a substrate using an etching gas is performed as a process of manufacturing a semiconductor device in some cases.

SUMMARY

The present disclosure provides some embodiments of a technique capable of improving the uniformity of an etching process in the plane of a substrate when etching a film formed on the surface of the substrate.

According to one embodiment of the present disclosure, there is provided a technique that includes partially etching a first film formed on a surface of a substrate by performing a cycle a predetermined number of times, the cycle including: (a) setting a temperature of the substrate having the first film formed on the surface to a first temperature; (b) stabilizing an in-plane temperature of the substrate at the first temperature; and (c) lowering the temperature of the substrate having the in-plane temperature stabilized at the first temperature from the first temperature to a second temperature that is lower than the first temperature, wherein in (c), an etching gas is supplied to the substrate for a predetermined period.

BRIEF DESCRIPTION OF THE DRAWINGS

FIG. 6A is a view showing the measurement results of the uniformity of an etching process in a wafer plane and the uniformity of an etching process between wafers in an Example, and FIG. 6B is a view showing the measurement results of the uniformity of an etching process in a wafer plane and the uniformity of an etching process between wafers in a Comparative Example.

DETAILED DESCRIPTION

Some Embodiments of the Present Disclosure

Some embodiments of the present disclosure will now be described with reference to FIGS. 1 to 4 and FIGS. 5A to 5D.

(1) Configuration of Substrate Processing Apparatus

Figure 1:
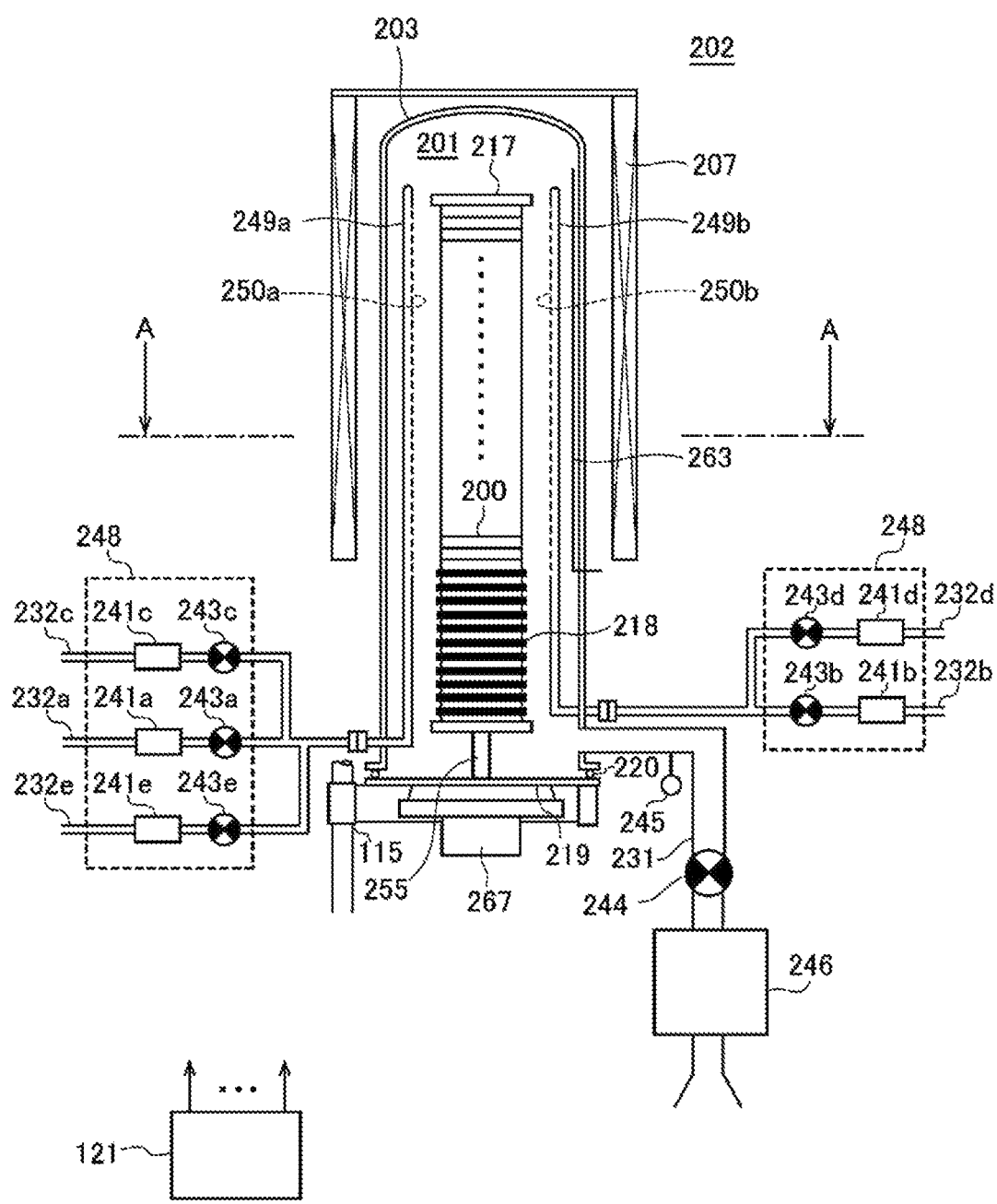
FIG. 1 is a schematic configuration diagram of a vertical process furnace of a substrate processing apparatus suitably used in one or more embodiments of the present disclosure, in which the process furnace portion is shown in a vertical sectional view.

As shown in FIG. 1, a process furnace 202 includes a heater 207 as a heating mechanism (temperature adjustment part). The heater 207 has a cylindrical shape and is vertically installed by being supported by a holding plate. The heater 207 also functions as an activation mechanism (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC), and is formed in a cylindrical shape with an upper end thereof closed and a lower end thereof opened. A process chamber 201 is formed in the hollow cylindrical portion of the reaction tube 203. The process chamber 201 is configured to be able to accommodate wafers 200 as substrates.

Inside the process chamber 201, nozzles 249a and 249b are installed so as to penetrate the lower side wall of the reaction tube 203. Gas supply pipes 232a and 232b are connected to the nozzles 249a and 249b, respectively.

Mass flow controllers (MFC) 241a and 241b as flow rate controllers (flow rate control parts) and valves 243a and 243b as opening/closing valves are installed in the gas supply pipes 232a and 232b sequentially from the upstream side of a gas flow. Gas supply pipes 232c and 232d are connected to the gas supply pipes 232a and 232b, respectively, on the downstream side of the valves 243a and 243b. MFCs 241c and 241d and valves 243c and 243d are respectively installed in the gas supply pipes 232c and 232d sequentially from the upstream side of a gas flow. A gas supply pipe 232e is connected to the gas supply pipe 232a on the downstream side of the valve 243a. An MFC 241e and a valve 243e are installed in the gas supply pipe 232e sequentially from the upstream side of a gas flow.

Figure 2:
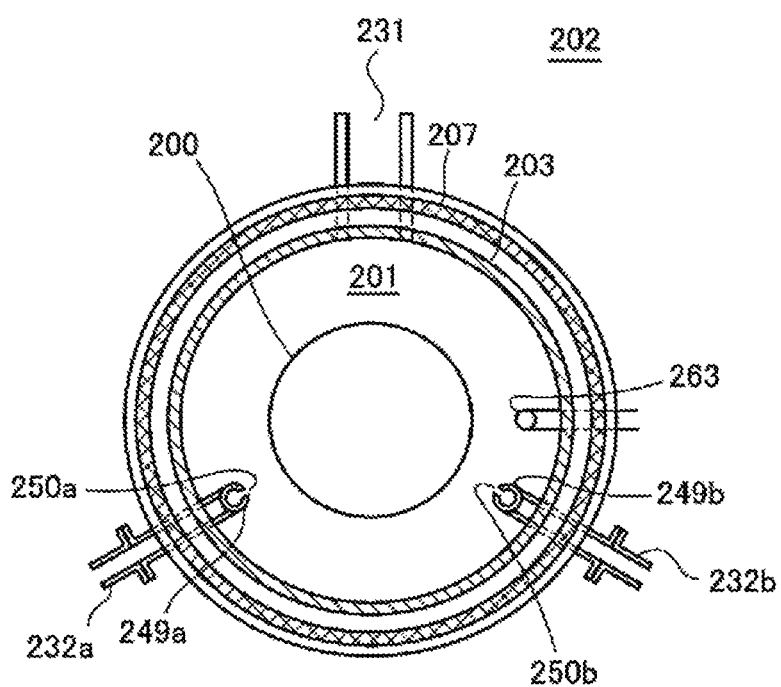
FIG. 2 is a schematic configuration diagram of the vertical process furnace of the substrate processing apparatus suitably used in the embodiments of the present disclosure, in which the process furnace portion is shown in a sectional view taken along line A-A in FIG. 1.

As shown in FIG. 2, the nozzles 249a and 249b are arranged in a space having an annular shape in a plan view between the inner wall of the reaction tube 203 and the wafers 200 and are installed to extend upward in the arrangement direction of the wafers 200 from the lower portion to the upper portion of the inner wall of the reaction tube 203. In other words, the nozzles 249a and 249b are respectively installed in a region horizontally surrounding a wafer arrangement region, in which the wafers 200 are arranged, on the lateral side of the wafer arrangement region so as to extend along the wafer arrangement region. Gas supply holes 250a and 250b for supplying gases are formed on the side surfaces of the nozzles 249a and 249b, respectively. The gas supply holes 250a and 250b are respectively opened so as to face the center of the reaction tube 203 and can supply gases toward the wafers 200. The gas supply holes 250a and 250b are formed from the lower portion to the upper portion of the reaction tube 203.

From the gas supply pipe 232a, a precursor gas, for example, a silicon (Si)-containing gas is supplied into the process chamber 201 via the MFC 241a, the valve 243a and the nozzle 249a. As the Si-containing gas, for example, a silicon hydride gas such as a monosilane ($SiH_4$, abbreviation: MS) gas or the like may be used.

From the gas supply pipe 232e, an etching gas is supplied into the process chamber 201 via the MFC 241e, the valve 243e, the gas supply pipe 232a and the nozzle 249a. As the etching gas, for example, a chlorine ($Cl_2$) gas which is a gas containing a halogen element (atom) may be used.

From the gas supply pipe 232b, a dopant gas is supplied into the process chamber 201 via the MFC 241b, the valve 243b and the nozzle 249b. As the dopant gas, for example, a phosphine ($PH_3$, abbreviation: PH) gas which is a gas containing phosphorus (P) as a dopant (impurity) may be used.

From the gas supply pipes 232c and 232d, a nitrogen ($N_2$) gas as inert gas is supplied into the process chamber 201 via the MFCs 241c and 241d, the valves 243c and 243d, the gas supply pipes 232a and 232b, and the nozzles 249a and 249b. The $N_2$ gas acts as a purge gas, a carrier gas, a dilution gas, or the like.

A precursor gas supply system is mainly constituted by the gas supply pipe 232a, the MFC 241a and the valve 243a. An etching gas supply system is mainly constituted by the gas supply pipe 232e, the MFC 241e and the valve 243e. A dopant gas supply system is mainly constituted by the gas supply pipe 232b, the MFC 241b and the valve 243b. An inert gas supply system is mainly constituted by the gas supply pipes 232c and 232d, the MFCs 241c and 241d, and the valves 243c and 243d.

Some or all of the above-described various supply systems may be configured as an integrated supply system 248 in which the valves 243a to 243e, the MFCs 241a to 241e and the like are integrated. The integrated supply system 248 is connected to each of the gas supply pipes 232a to 232e and is configured so that the operations of supply of various gases into the gas supply pipes 232a to 232e, i.e., the opening and closing operations of the valves 243a to 243e, the flow rate adjustment operation by the MFCs 241a to 241e, and the like are controlled by the controller 121 which will be described later. The integrated supply system 248 is formed of integral type or division type integrated units and may be attached to and detached from the gas supply pipes 232a to 232e and the like on an integrated unit basis. The integrated supply system 248 is configured so that the maintenance, replacement, expansion and the like of the integrated supply system 248 can be performed on an integrated unit basis.

An exhaust pipe 231 for exhausting the atmosphere in the process chamber 201 is connected to the lower portion of the side wall of the reaction tube 203. A vacuum pump 246 as an evacuation device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured so that it can perform or stop vacuum evacuation of the interior of the process chamber 201 by being opened and closed in a state in which the vacuum pump 246 is operated. Furthermore, the APC valve 244 is configured so that it can regulate the pressure inside the process chamber 201 by adjusting the valve opening degree based on the pressure information detected by the pressure sensor 245 in a state in which the vacuum pump 246 is operated. An exhaust system is mainly constituted by the exhaust pipe 231, the pressure sensor 245 and the APC valve 244. The vacuum pump 246 may be included in the exhaust system.

A seal cap 219 as a furnace port lid capable of airtightly closing the lower end opening of the reaction tube 203 is installed below the reaction tube 203. The seal cap 219 is made of a metallic material such as, for example, stainless steel or the like, and is formed in a disc shape. On the upper surface of the seal cap 219, there is installed an O-ring 220 as a seal member which abuts against the lower end of the reaction tube 203. Below the seal cap 219, there is installed a rotation mechanism 267 for rotating a boat 217 to be described later. A rotating shaft 255 of the rotation mechanism 267 is installed to pass through the seal cap 219 and is connected to the boat 217. The rotation mechanism 267 is configured to rotate the wafers 200 by rotating the boat 217. The seal cap 219 is configured to be raised or lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising or lowering the seal cap 219.

A boat 217 as a substrate support tool is configured so as to support a plurality of wafers 200, for example, 25 to 200 wafers 200 in a horizontal posture and in multiple stages while vertically arranging the wafers 200 with their centers thereof aligned with each other, i.e., so as to arrange the wafers 200 at intervals. The boat 217 is made of a heat-resistant material such as, for example, quartz or SiC. Heat insulating plates 218 made of a heat-resistant material such as, for example, quartz or SiC, are supported in a horizontal posture and in multiple stages at the bottom of the boat 217.

Inside the reaction tube 203, there is installed a temperature sensor 263 as a temperature detector. By adjusting the state of supply of electric power to the heater 207 based on the temperature information detected by the temperature sensor 263, the temperature inside the process chamber 201 becomes a desired temperature distribution. The temperature sensor 263 is installed along the inner wall of the reaction tube 203.

Figure 3:
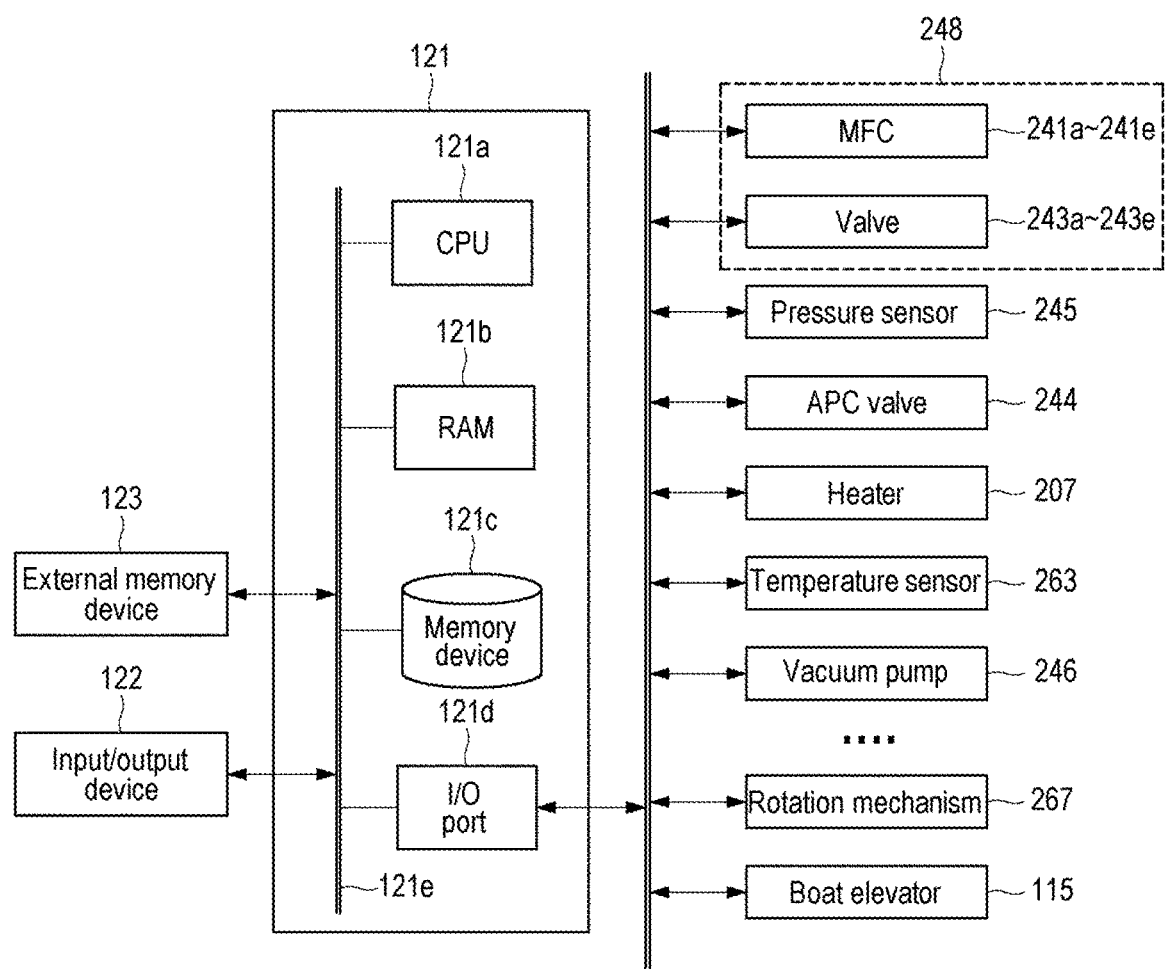
FIG. 3 is a schematic configuration diagram of a controller of the substrate processing apparatus suitably used in the embodiments of the present disclosure, in which a control system of the controller is shown in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is composed of, for example, a flash memory, an HDD (Hard Disk Drive), or the like. In the memory device 121c, there are readably stored a control program for controlling the operation of the substrate processing apparatus, a process recipe in which procedures and conditions of substrate processing to be described later are written, and the like. The process recipe is a combination for causing the controller 121 to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data and the like read by the CPU 121a are temporarily held.

The I/O port 121d is connected to the MFCs 241a to 241e, the valves 243a to 243e, the pressure sensor 245, the APC valve 244, the vacuum pump 246, the heater 207, the temperature sensor 263, the rotation mechanism 267, the boat elevator 115, and the like.

The CPU 121a is configured to read and execute the control program from the memory device 121c and to read the recipe from the memory device 121c in response to an input of an operation command from the input/output device 122 or the like. The CPU 121a is configured to, according to the contents of the recipe thus read, control the flow rate adjustment operation of various gases by the MFCs 241a to 241e, the opening and closing operations of the valves 243a to 243e, the opening and closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotation mechanism 267, the raising or lowering operation of the boat 217 by the boat elevator 115, and the like.

The controller 121 may be configured by installing, in the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory or the like, and so forth. The memory device 121c and the external memory device 123 are configured as a computer readable recording medium. Hereinafter, the memory device 121c and the external memory device 123 are collectively and simply referred to as a recording medium. As used herein, the term "recording medium" may include only the memory device 121c, only the external memory device 123, or both. The provision of the program to the computer may be performed by using a communication means such as the Internet or a dedicated line without having to use the external memory device 123.

(2) Substrate Processing Process

As a process of manufacturing a semiconductor device using the substrate processing apparatus described above, an example of a substrate processing sequence in which a silicon film (Si film) is formed on a wafer 200 as a substrate, i.e., an example of a film-forming sequence will be described mainly with reference to FIGS. 4 and 5A to 5D. In the following description, the operations of the respective parts constituting the substrate processing apparatus are controlled by the controller 121.

Figure 4:
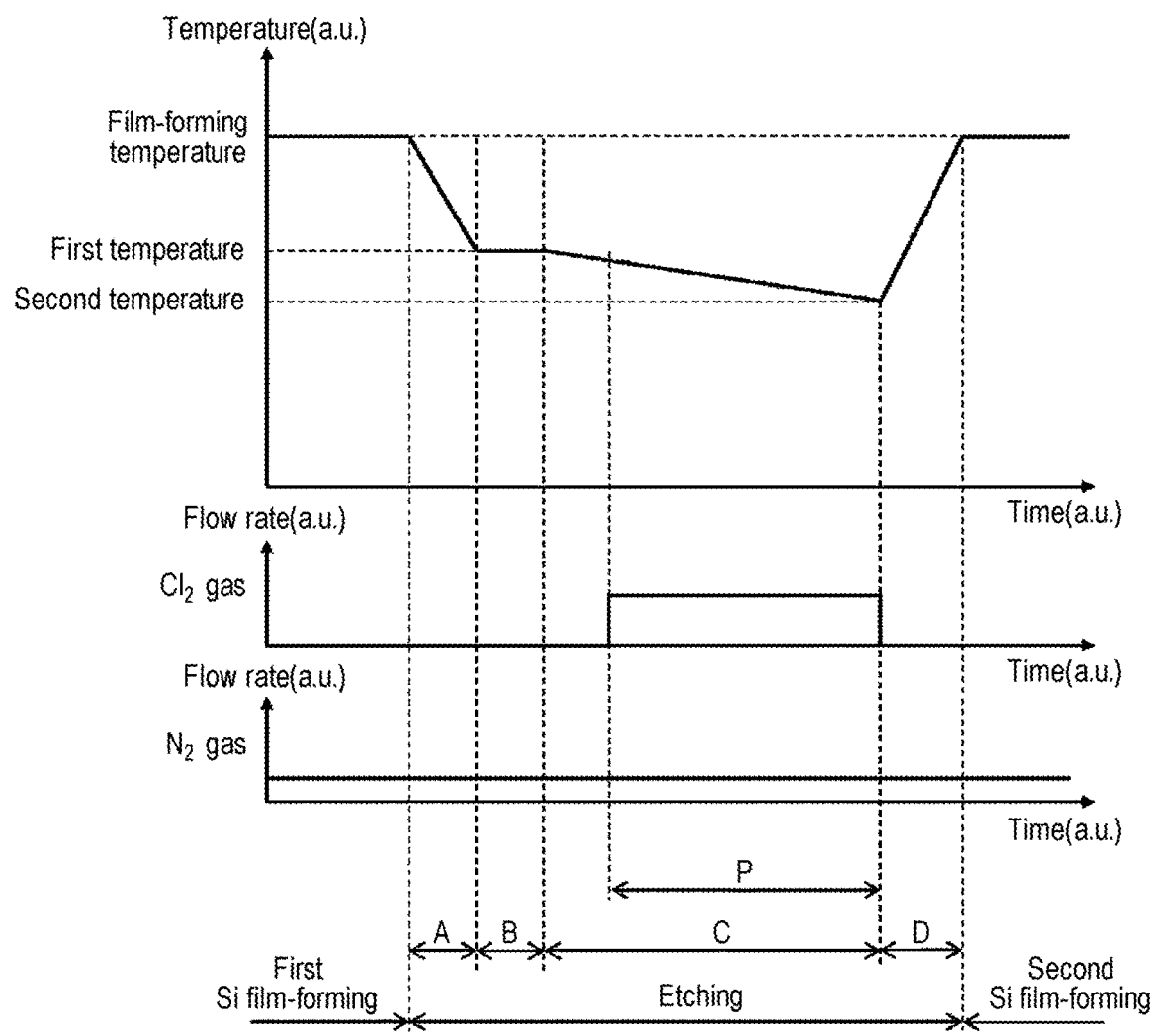
FIG. 4 is a flowchart showing a substrate processing sequence according to some embodiments of the present disclosure.

In the film-forming sequence shown in FIG. 4, a step of forming a first film (a first Si film) so as to fill a recess formed on a surface of a wafer 200, a step of partially etching the first Si film formed on the surface of the wafer 200 and a step of further forming a second film (second Si film) on the partially-etched first Si film are performed to thereby fill the recess with the first Si film and the second Si film.

In the step of partially etching the first Si film, a cycle which includes step A of setting the temperature of the wafer 200 having the first Si film formed on the surface thereof to a first temperature, step B of stabilizing the in-plane temperature of the wafer 200 at the first temperature and step C of lowering the temperature of the wafer 200 having the in-plane temperature stabilized at the first temperature from the first temperature to a second temperature lower than the first temperature and supplying a $Cl_2$ gas as an etching gas to the wafer 200 for a predetermined period P during the temperature lowering period is performed a predetermined number of times. In FIG. 4, the execution periods of steps A, B and C, the execution period of step D to be described later and the predetermined period P are denoted by A, B, C, D and P, respectively.

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

(Wafer Charging and Boat Loading)

A plurality of wafers 200 is charged to the boat 217 (wafer charging). Thereafter, as shown in FIG. 1, the boat 217 supporting the plurality of wafers 200 is lifted by the boat elevator 115 and is loaded into the process chamber 201 (boat loading). In this state, the seal cap 219 seals the lower end of the reaction tube 203 via the O-ring 220.

Figure 5A:
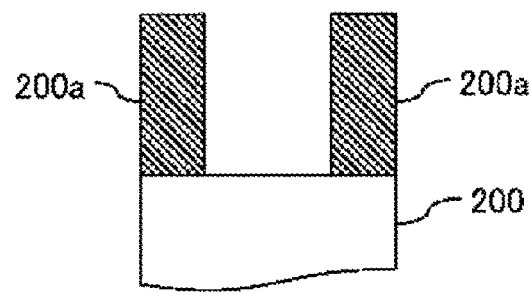
FIG. 5A is an enlarged sectional view showing a surface structure of a wafer before forming a first Si film.

As the wafer 200, for example, a Si substrate formed of monocrystalline Si or a substrate having a monocrystalline Si film formed on its surface may be used. As shown in FIG. 5A, a recess is formed on the surface of the wafer 200. The bottom of the recess is formed of monocrystalline Si. The side portion and the top portion of the recess are formed of an insulating film 200a such as a silicon oxide film (SiO film), a silicon nitride film (SiN film), a silicon oxycarbonitride film (SiOCN film) or the like. The surface of the wafer 200 is in a state in which the monocrystalline Si and the insulating film 200a are exposed.

(Pressure Regulation and Temperature Adjustment)

The inside of the process chamber 201, i.e., the space where the wafer 200 exists, is evacuated into vacuum (evacuated into a reduced pressure) by the vacuum pump 246 so that the pressure inside the process chamber 201 becomes a desired pressure (degree of vacuum). At this time, the pressure inside the process chamber 201 is measured by the pressure sensor 245, and the APC valve 244 is subjected to feedback control based on the measured pressure information. Furthermore, the wafer 200 in the process chamber 201 is heated by the heater 207 so that the wafer 200 has a desired temperature (film-forming temperature). At this time, the state of supply of electric power to the heater 207 is feedback-controlled based on the temperature information detected by the temperature sensor 263 so that the inside of the process chamber 201 has a desired temperature distribution. Moreover, the rotation of the wafer 200 by the rotation mechanism 267 is started. The operation of the vacuum pump 246 and the heating and rotation of the wafer 200 are continuously performed at least until the processing on the wafer 200 is completed.

(First Si Film-Forming Step)

Thereafter, an MS gas is supplied to the wafer 200 in the process chamber 201. In this step, the valve 243a is opened to allow the MS gas to flow into the gas supply pipe 232a. The flow rate of the MS gas is adjusted by the MFC 241a. The MS gas is supplied into the process chamber 201 via the nozzle 249a and is exhausted from the exhaust pipe 231. At this time, the MS gas is supplied to the wafer 200 (MS gas supply step). At this time, the valves 243c and 243d are opened to allow an $N_2$ gas to flow into the gas supply pipes 232c and 232d. The flow rate of the $N_2$ gas is adjusted by the MFCs 241c and 241d. The $N_2$ gas is supplied to the process chamber 201 via the nozzles 249a and 249b and is exhausted from the exhaust pipe 231. The supply of the $N_2$ gas into the process chamber 201 in the MS gas supply step may not be carried out.

Figure 5B:
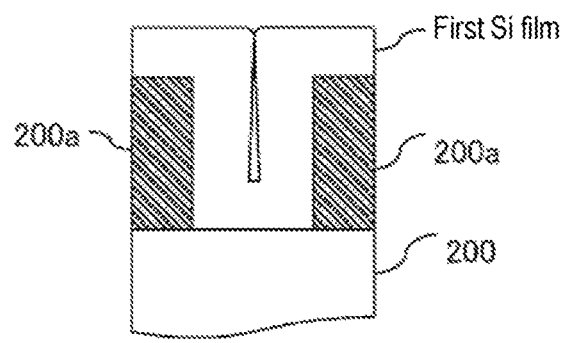
FIG. 5B is an enlarged sectional view showing the surface structure of the wafer after forming a first Si film.

By supplying the MS gas to the wafer 200, it is possible to form a first Si film so as to fill the inside of the recess as shown in FIG. 5B. In this film-forming process, the surface side of the recess may be occluded by the first Si film which has grown so as to overhang from the side portion and the top portion of the recess. A non-filled region, i.e., a void, a seam or the like (hereinafter referred to as a hollow portion for the sake of convenience) extending in a depth region (direction) thereof may be formed in the recess. The hollow portion is generated as the front side of the recess is closed before the inside of the recess is completely filled with the first Si film, the MS gas fails to reach the inside of the recess, and the growth of the first Si film in the recess is stopped. The hollow portion is likely to be formed as the aspect ratio (the depth of the recess/the width of the recess) of the recess increases, specifically, as the aspect ratio becomes 1 or more, for example, 20 or more, ultimately 50 or more. Furthermore, as the aspect ratio increases, the hollow portion is more likely to be formed on the bottom side in the recess. Under the processing conditions described later, Si undergoes amorphous growth at least in the side portion and the top portion of the recess. That is, the crystal structure of at least the portion of the first Si film grown so as to overhang from the side portion and the top portion of the recess becomes amorphous.

After forming the first Si film, the valve 243a is closed to stop the supply of the MS gas into the process chamber 201. The supply of the MS gas may be stopped before the surface side of the recess is blocked by the first Si film, or may be stopped after the surface side of the recess is completely blocked. Thereafter, the inside of the process chamber 201 is evacuated to remove the gas or the like remaining in the process chamber 201 from the inside of the process chamber 201. At this time, the valves 243c and 243d are opened to supply the $N_2$ gas into the process chamber 201. The $N_2$ gas acts as a purge gas (purging step).

As the processing conditions in the first Si film-forming step, the following may be exemplified.
MS gas supply flow rate: 10 to 2,000 sccm
$N_2$ gas supply flow rate (in each gas supply pipe): 0 to 10,000 sccm
Gas supply time: 1 to 400 minutes
Processing temperature (film-forming temperature): 450 to 550 degrees C., specifically, 450 to 530 degrees C.
Processing pressure: 1 to 900 Pa
The notation of a numerical range such as "450 to 550 degrees C." or the like used in this specification means that the lower limit value and the upper limit value are included in the range. Therefore, "450 to 550 degrees C." means "450 degrees C. or more and 550 degrees C. or less." The same applies to other numerical ranges.

Since the crystallization temperature of Si is about 550 to 560 degrees C., the crystal structure of the first Si film can be made amorphous by setting the film-forming temperature to 550 degrees C. or lower, specifically to a temperature lower than 550 degrees C. This makes it possible to increase the etching rate of the first Si film in an etching step to be described later, thereby improving the productivity. By setting the film-forming temperature to a temperature falling within a range of 550 to 560 degrees C., it is possible to make the crystal structure of the first Si film into a mixed crystal structure of an amorphous structure and a polycrystalline (poly) structure. By setting the film-forming temperature to a temperature higher than 560 degrees C., it is possible to make the crystal structure of the first Si film into a polycrystalline structure.

As the precursor gas, in addition to the MS gas, it may be possible to use a silicon hydride gas represented by a general formula $Si_nH_{2n+2}$ (where n is an integer of 1 or more), such as a disilane ($Si_2H_6$, abbreviation: DS) gas, a trisilane ($Si_3H_8$) gas, a tetrasilane ($Si_4H_{10}$) or the like. Furthermore, as the precursor gas, it may also be possible to use a chlorosilane-based gas such as a monochlorosilane ($SiH_3CL$ abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like.

As the inert gas, in addition to the $N_2$ gas, it may be possible to use a rare gas such as an Ar gas, a He gas, a Ne gas, a Xe gas or the like. This holds true in the respective steps to be described later.

(Etching Step)

After the first Si film-forming step is completed, steps A to D to be described later are performed in order.

[Step A]

First, step A is performed. In this step, the output of the heater 207 is adjusted and the temperature of the wafer 200 having the first Si film formed on its surface is set to a first temperature. In FIG. 4, there is shown an example where the first temperature is set to a temperature lower than the film-forming temperature and, in step A, the temperature of the wafer 200 is lowered (changed) from the film-forming temperature to the first temperature. At this time, the valves 243c and 243d are opened to supply the $N_2$ gas into the process chamber 201. Alternatively, the supply of the $N_2$ gas into the process chamber 201 may not be carried out.

As the processing conditions in this step, the following may be exemplified.
$N_2$ gas supply flow rate: 0 to 5,000 sccm
Processing temperature (first temperature): 300 to 500 degrees C.
Processing pressure: 10 to 1,000 Pa
The first temperature shown here is a temperature lower than the crystallization temperature of Si, and is a temperature lower than a critical temperature at which the crystalline state of the first Si film formed on the wafer 200 shifts from an amorphous state to a polycrystalline state.

[Step B]

After the temperature of the wafer 200 reaches the first temperature, step B is performed. In this step, the state in which the temperature of the wafer 200 is set to the first temperature is maintained for a predetermined time. In other words, the substrate processing apparatus waits for a predetermined time while keeping the temperature of the wafer 200 at the first temperature. As a result, the in-plane temperature of the wafer 200 having the first Si film formed on its surface is stabilized at the first temperature. That is, the in-plane temperature of the wafer 200 is set to a uniform temperature (first temperature) over the entire surface of the wafer 200. At this time, the supply of the $N_2$ gas into the process chamber 201 is maintained. Alternatively, the supply of the $N_2$ gas into the process chamber 201 may not be carried out. The processing conditions in this step are the same as the processing conditions in step A except that the temperature of the wafer 200 is changed from the film-forming temperature to the first temperature.

[Step C]

After the in-plane temperature of the wafer 200 is stabilized at the first temperature, step C is performed. In this step, the output of the heater 207 is adjusted to lower the temperature of the wafer 200 having the in-plane temperature stabilized at the first temperature from the first temperature to a second temperature that is lower than the first temperature. At this time, the supply of the $N_2$ gas into the process chamber 201 is maintained. Alternatively, the supply of the $N_2$ gas into the process chamber 201 may not be carried out.

In this step, a $Cl_2$ gas is supplied to the wafer 200 for a predetermined period P during the temperature lowering period. Specifically, in this step, after starting the temperature lowering of the wafer 200, the substrate processing apparatus waits until a lapse of a predetermined time without supplying the $Cl_2$ gas to the wafer 200 (standby step). Then, after the lapse of a predetermined time, the valve 243e is opened to allow the $Cl_2$ gas to flow into the gas supply pipe 232e. The flow rate of the $Cl_2$ gas is adjusted by the MFC 241e. The $Cl_2$ gas is supplied to the process chamber 201 through the gas supply pipe 232a and the nozzle 249a and is exhausted from the exhaust pipe 231. At this time, the $Cl_2$ gas is supplied to the wafer 200 ($Cl_2$ gas supply step). In step C (the standby step and the $Cl_2$ gas supply step), as in steps A and B, the supply of the $N_2$ gas into the process chamber 201 is maintained. Alternatively, the supply of the $N_2$ gas into the process chamber 201 may not be carried out. However, the supply of the $N_z$ gas into the process chamber 201 may be carried out, because the $Cl_2$ gas can be uniformly diffused throughout the process chamber 201 by carrying out the supply of the $N_2$ gas.

Figure 5C:
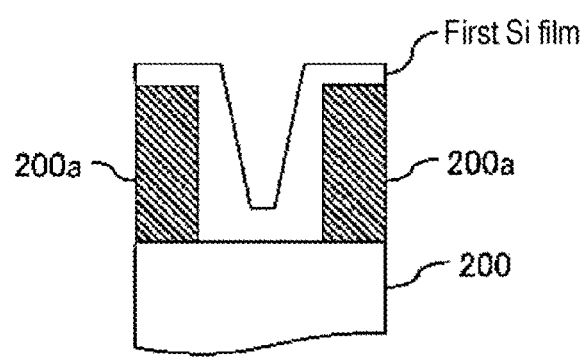
FIG. 5C is an enlarged sectional view showing the surface structure of the wafer after etching a part of the first Si film.

By supplying the $Cl_2$ gas to the wafer 200, it is possible to partially etch the first Si film formed on the wafer 200. By removing the portion of the first Si film which closes the front surface side of the recess, the top of the hollow portion formed below the portion of the first Si film which closes the front surface side of the recess can be opened to expose the inner wall (side wall or bottom portion) of the hollow portion. By continuing the etching process for a predetermined time in this state, it is possible to further etch the first Si film constituting the inner wall of the hollow portion, thereby enlarging the opening. The supply amount of the $Cl_2$ gas supplied into the hollow portion gradually decreases from the surface side to the bottom side. As shown in FIG. 5C, the vertical sectional shape of the exposed hollow portion comes close to a V-like shape or an inverted trapezoidal shape in which the opening width gradually increases from the bottom side to the surface side. By processing the exposed hollow portion into such a shape, it is possible to promote the supply of the MS gas into the exposed hollow portion in a second Si film-forming step to be described later. As a result, it becomes possible to completely fill the inside of the recess with the Si film in a void-free and seamless state.

The $Cl_2$ gas supplied into the process chamber 201 flows inward from the side portion (outer peripheral portion) of the wafer 200 toward the central portion of the wafer 200. That is, the $Cl_2$ gas supplied into the process chamber 201 makes contact with the outer periphery of the first Si film formed on the surface of the wafer 200 and then makes contact with the central portion of the wafer 200. A part of the $Cl_2$ gas brought into contact with the outer peripheral portion of the wafer 200 is consumed by an etching reaction. Therefore, the supply amount of the $Cl_2$ gas in the central portion of the wafer 200 is smaller than the supply amount of the $Cl_2$ gas in the outer peripheral portion of the wafer 200. As a result, the etching rate of the first Si film in the central portion of the wafer 200 tends to be smaller than the etching rate of the first Si film in the outer peripheral portion of the wafer 200. That is, when the $Cl_2$ gas is allowed to flow from the outer peripheral portion of the wafer 200 toward the central portion of the wafer 200 as in the present embodiments, the in-plane uniformity of the etching process (hereinafter also simply referred to as in-plane uniformity) tends to decrease (deteriorate).

In order to solve the aforementioned problem, in the present embodiments, there is utilized a bias in a temperature distribution in the plane of the wafer 200 occurring after the start of the temperature lowering of the wafer 200, specifically, a temperature difference occurring between the outer peripheral portion and the central portion of the wafer 200. This is because, after starting the temperature lowering of the wafer 200, the temperature lowering rate at the outer peripheral portion of the wafer 200 is larger than the temperature lowering rate at the central portion of the wafer 200. When a predetermined time has elapsed from the start of the temperature lowering of the wafer 200, the temperature of the outer peripheral portion of the wafer 200 becomes lower than the temperature of the central portion of the wafer 200. When a time falling within a range of 10 to 20 minutes elapses from the start of the temperature lowering of the wafer 200, the temperature difference between the outer peripheral portion of the wafer 200 and the central portion of the wafer 200 becomes a predetermined temperature difference falling within a range of, for example, 1 to 10 degrees C.

In the present embodiments, after starting the temperature lowering of the wafer 200 in step C, the supply of the $Cl_2$ gas to the wafer 200 is started after the temperature of the outer peripheral portion of the wafer 200 becomes lower than the temperature of the central portion of the wafer 200. Specifically, the supply of the $Cl_2$ gas to the wafer 200 is started after the temperature difference between the outer peripheral portion of the wafer 200 and the central portion of the wafer 200 becomes the predetermined temperature difference described above. The predetermined period P during which the $Cl_2$ gas is supplied in this step refers to a period in which the temperature of the outer peripheral portion of the wafer 200 is lower than the temperature of the central portion of the wafer 200, specifically a period in which the temperature difference between the outer peripheral portion of the wafer 200 and the central portion of the wafer 200 becomes the predetermined temperature difference described above.

By setting the predetermined period P for the supply of the $Cl_2$ gas as described above, it is possible to improve the in-plane uniformity of the etching process of the first Si film. This is because, in the plane of the wafer 200, the etching of the first Si film tends to be promoted in a region where the temperature is high and tends to be suppressed in a region where the temperature is low. After starting the temperature lowering of the wafer 200, the supply of the $Cl_2$ gas to the wafer 200 is started after the temperature of the outer peripheral portion of the wafer 200 becomes lower than the temperature of the central portion of the wafer 200, whereby it is possible to appropriately proceed with the etching reaction of the first Si film at the central portion of the wafer 200 while appropriately suppressing the etching reaction of the first Si film at the outer peripheral portion of the wafer 200. As a result, even when the $Cl_2$ gas is allowed to flow from the outer peripheral portion of the wafer 200 toward the central portion of the wafer 200 as in the present embodiments, the first Si film formed on the wafer 200 can be etched at a substantially uniform rate over the entire plane (surface) of the wafer 200. That is, the tendency of the variation (distribution) of the etching rate in the plane of the wafer 200 generated by allowing the $Cl_2$ gas to flow from the outer peripheral portion of the wafer 200 toward the central portion of the wafer 200 can be cancelled by the tendency of the variation (distribution) of the etching rate in the plane of the wafer 200 generated by the temperature difference between the outer peripheral portion of the wafer 200 and the central portion of the wafer 200. This makes it possible to improve the in-plane uniformity of the etching process of the first Si film. After starting the temperature lowering of the wafer 200, the supply of the $Cl_2$ gas to the wafer 200 is started after the temperature difference between the outer peripheral portion of the wafer 200 and the central portion of the wafer 200 becomes a predetermined temperature difference, whereby it is possible to reliably improve the in-plane uniformity of the etching process of the first Si film.

In this step, before the temperature of the outer peripheral portion of the wafer 200 becomes lower than the temperature of the central portion of the wafer 200, the supply of the $Cl_2$ gas to the wafer 200 is not carried out. This makes it possible to reliably improve the in-plane uniformity of the etching process of the first Si film. In this step, before the temperature difference between the outer peripheral portion of the wafer 200 and the central portion of the wafer 200 becomes a predetermined temperature difference, the supply of the $Cl_2$ gas to the wafer 200 is not carried out. That is, even when the temperature of the outer peripheral portion of the wafer 200 becomes lower than the temperature of the central portion of the wafer 200, when the temperature difference between the outer peripheral portion of the wafer 200 and the central portion of the wafer 200 is not a predetermined temperature difference, the supply of the $Cl_2$ gas to the wafer 200 is not carried out. This makes it possible to more reliably improve the in-plane uniformity of the etching process of the first Si film.

As the processing conditions in this step, the following may be exemplified.
Temperature lowering start temperature (first temperature): 300 to 500 degrees C.
Temperature lowering end temperature (second temperature): 250 to 490 degrees C.
Temperature lowering rate: 0.1 to 20 degrees C./min
Temperature lowering time: 5 to 60 minutes
$N_2$ gas supply time: 5 to 60 minutes
$Cl_2$ gas supply time (predetermined period P): 1 to 55 minutes
$Cl_2$ gas supply flow rate: 30 to 1,000 sccm
Other processing conditions are the same as the processing conditions in step A.

The $Cl_2$ gas is supplied to the wafer 200 in a state in which the temperature difference between the outer peripheral portion of the wafer 200 and the central portion of the wafer 200 is a temperature difference of 1 degrees C. or higher and 10 degrees C. or lower, for example, a temperature difference of about 5 degrees C. When the temperature difference is less than 1 degrees C., it may be difficult to appropriately generate an etching reaction at the central portion of the wafer 200 while appropriately suppressing an etching reaction at the outer peripheral portion of the wafer 200. By setting the temperature difference to a temperature of 1 degrees C. or higher, it is possible to solve the aforementioned problem and to improve the in-plane uniformity of the etching process of the first Si film. In addition, when the temperature difference exceeds 10 degrees C., the etching reaction at the outer peripheral portion of the wafer 200 may be excessively suppressed, or the etching reaction at the central portion of the wafer 200 may be excessively generated, whereby the in-plane uniformity of the etching process of the first Si film may be deteriorated in some cases. By setting the temperature difference to a temperature of 10 degrees C. or lower, it is possible to solve the aforementioned problem and to improve the in-plane uniformity of the etching process of the first Si film.

By controlling (appropriately changing and adjusting) each condition within the processing condition range described above, it is possible to perform a desired etching process. For example, by controlling at least one of the $Cl_2$ gas supply flow rate, the first temperature and the second temperature, it is possible to finely adjust the etching rate of the first Si film. Furthermore, by controlling at least one of the temperature lowering rate and the period until the supply of the $Cl_2$ gas is started after the start of the temperature lowering, it is possible to finely adjust the temperature difference between the central portion of the wafer 200 and the outer peripheral portion of the wafer 200 at the time of starting the supply of the $Cl_2$ gas. This makes it possible to optimize the etching amounts in the central portion and the outer peripheral portion of the wafer 200, respectively.

(Temperature Raising Step)

After etching a part of the first Si film just as much as a desired amount, the valve 243e is closed to stop the supply of the $Cl_2$ gas into the process chamber 201. Thereafter, the inside of the process chamber 201 is evacuated to remove the gas or the like remaining in the process chamber 201 from the inside of the process chamber 201. At this time, the supply of the $N_2$ gas into the process chamber 201 is continued to purge the inside of the process chamber 201 with the $N_2$ gas (purging step). In addition, the output of the heater 207 is adjusted, and the temperature of the wafer 200 having the partially-etched first Si film is raised from the second temperature to a film-forming temperature that is higher than each of the first temperature and the second temperature.

(Second Si Film-Forming Step)

After the etching step is completed, an MS gas is supplied to the wafer 200 in the process chamber 201 by the same processing procedure as the processing procedure in the MS gas supply step of the first Si film-forming step. That is, the MS gas is supplied to the first Si film formed on the wafer 200 and subjected to the etching process, i.e., the partially-etched first Si film (MS gas supply step). The supply time of the MS gas is set to a time falling within a range of, for example, 1 to 300 minutes. Other processing conditions are the same as the processing conditions in the MS gas supply step of the first Si film-forming step.

Figure 5D:
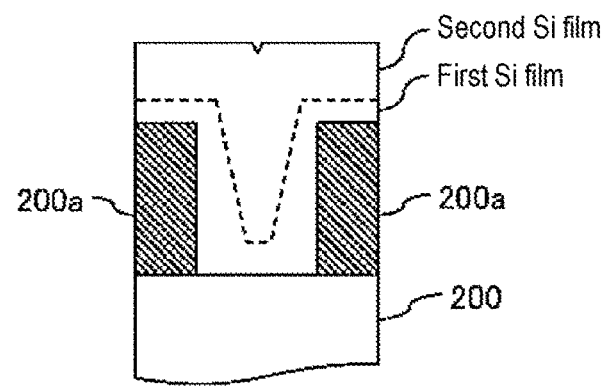
FIG. 5D is an enlarged sectional view showing the surface structure of the wafer after forming a second Si film on the first Si film, a part of which is etched.

By supplying the MS gas to the wafer 200, as shown in FIG. 5D, it is possible to form a second Si film on the wafer 200, i.e., on the surface of the partially-etched first Si film. As described above, by performing the etching step, the hollow portion of the first Si film comes into an open state with its upper portion opened. The vertical sectional shape of the hollow portion is changed to a V-like shape in which the opening width gradually increases from the bottom side toward the surface side. As a result, the second Si film does not grow so as to overhang from the side portion of the opened hollow portion or the like. That is, even when the MS gas supply step is continued, the surface side of the opened hollow portion is not blocked, and the MS gas is continuously supplied into the hollow portion in a reliable manner. As a result, no hollow portion is formed in the second Si film. The inside of the recess formed on the surface of the wafer 200 is filled with the first Si film and the second Si film completely, i.e., in a void-free and seamless state. Under the processing conditions in this step, the crystal structure of the second Si film is amorphous.

Thereafter, the valve 243a is closed to stop the supply of the MS gas into the process chamber 201. Then, the inside of the process chamber 201 is evacuated by the same processing procedure as the processing procedure in the purging step of the first Si film-forming step, whereby the gas or the like remaining in the process chamber 201 is removed from the inside of the process chamber 201 (purging step).

(After-Purging and Atmospheric Pressure Restoration)

After the second Si film-forming step is completed, an $N_2$ gas is supplied into the process chamber 201 from each of the gas supply pipes 232c and 232d and is exhausted from the exhaust pipe 231. As a result, the interior of the process chamber 201 is purged, whereby the gas, the reaction byproduct and the like remaining in the process chamber 201 are removed from the inside of the process chamber 201 (after-purging). Thereafter, the atmosphere in the process chamber 201 is replaced with an inert gas (inert gas replacement), and the pressure inside the process chamber 201 is restored to the atmospheric pressure (atmospheric pressure restoration).

(Boat Unloading and Wafer Discharging)

Thereafter, the seal cap 219 is lowered by the boat elevator 115, the lower end of the reaction tube 203 is opened, and the processed wafers 200 are unloaded from the lower end of the reaction tube 203 to the outside of the reaction tube 203 in a state in which they are supported by the boat 217 (boat unloading). The processed wafers 200 are taken out to the outside of the reaction tube 203 and then discharged from the boat 217 (wafer discharging).

(3) Effects of the Present Embodiments

According to the present embodiments, one or more of the following effects may be obtained.

(a) By supplying the $Cl_2$ gas to the wafer 200 for the predetermined period P during the temperature lowering period of the wafer 200 in step C, it is possible to improve the in-plane uniformity of the etching process of the first Si film.

That is, after the temperature of the outer peripheral portion of the wafer 200 becomes lower than the temperature of the central portion of the wafer 200, the supply of the $Cl_2$ gas to the wafer 200 is started. Therefore, it is possible to appropriately generate the etching reaction of the first Si film at the central portion of the wafer 200 while properly suppressing the etching reaction of the first Si film at the outer peripheral portion of the wafer 200. As a result, even when the $Cl_2$ gas is allowed to flow from the outer peripheral portion of the wafer 200 toward the central portion of the wafer 200, it is possible to improve the in-plane uniformity of the etching process of the first Si film. Furthermore, after starting the temperature lowering of the wafer 200, the supply of the $Cl_2$ gas to the wafer 200 is started after the temperature difference between the outer peripheral portion of the wafer 200 and the central portion of the wafer 200 becomes a predetermined temperature difference. Therefore, it is possible to reliably improve the in-plane uniformity of the etching process of the first Si film.

Before the temperature of the outer peripheral portion of the wafer 200 becomes lower than the temperature of the central portion of the wafer 200, the supply of the $Cl_2$ gas to the wafer 200 is not carried out. Therefore, it is possible to reliably improve the in-plane uniformity of the etching process of the first Si film. Furthermore, before the temperature difference between the outer peripheral portion of the wafer 200 and the central portion of the wafer 200 becomes a predetermined temperature difference, the supply of the $Cl_2$ gas to the wafer 200 is not carried out even when the temperature of the outer peripheral portion of the wafer 200 becomes lower than the temperature of the central portion of the wafer 200. Therefore, it is possible to more reliably improve the in-plane uniformity of the etching process of the first Si film.

In the etching step, when the $Cl_2$ gas is supplied to the wafer 200 during the temperature raising period of the wafer 200, the etching reaction of the first Si film in the outer peripheral portion of the wafer 200 close to the heater 207 may be excessively generated and the etching reaction of the first Si film in the central portion of the wafer 200 far from the heater 207 may be excessively suppressed in some cases. As a result, the in-plane uniformity of the etching process of the first Si film tends to decrease (deteriorate).

(b) In step A, the temperature of the wafer 200 having the first Si film formed on its surface is set to the first temperature and, in step B, the in-plane temperature of the wafer 200 having the first Si film formed thereon is stabilized at the first temperature. Therefore, in the subsequent step C, it is possible to reliably create a state in which the temperature of the outer peripheral portion of the wafer 200 is lower than the temperature of the central portion of the wafer 200. As a result, it is possible to improve the in-plane uniformity of the etching process of the first Si film, as compared with a case where step C is performed without carrying out step B after performing step A. This is because, in the case where step C is performed without carrying out step B after performing step A, step C is started in a state in which the in-plane temperature of the wafer 200 is unstable, for example, a state in which a variation is present in the in-plane temperature of the wafer 200. As a result, in step C, it may be difficult to create a desired temperature distribution in which the temperature of the outer peripheral portion of the wafer 200 is lower than the temperature of the central portion of the wafer 200.

(c) The film-forming temperature in the first Si film-forming step is set to a temperature at which the crystalline state of the first Si film can be made amorphous, and the processing temperature (the first temperature or the second temperature) in the etching step is set to a temperature at which the first Si film is kept in an amorphous state, whereby the crystallization of the first Si film in these steps can be avoided. As a result, in the etching step, it is possible to keep the etching rate of the first Si film high and improve the productivity of substrate processing. In addition, it is possible to avoid the local crystallization of the first Si film, i.e., the variation in the crystalline state of the first Si film in the plane of the wafer 200. It is possible to suppress the formation of unevenness on the surface of the etched first Si film due to the variation in the crystalline state (the variation in the ease of etching). As a result, it is possible to avoid the deterioration in the interface roughness between the first Si film and the second Si film and the deterioration in the surface roughness of the finally-formed Si film (a laminated film of the first Si film and the second Si film), i.e., the decrease in the smoothness of the film.

(d) By supplying the $Cl_2$ gas to the wafer 200 for the predetermined period P during the temperature lowering period of the wafer 200 in step C, it is possible to improve the wafer-to-wafer uniformity of the etching process of the first Si film. That is, by properly performing the etching process not only at the outer peripheral portion of the wafer 200 but also at the central portion of the wafer 200, it is possible to prevent an unreacted $Cl_2$ gas from flowing into and staying on the downstream side of a gas flow (the lower side in the wafer arrangement region). As a result, it is possible to suppress excessive progress of the etching process on the lower side in the wafer arrangement region and to improve the wafer-to-wafer uniformity of the etching process.

(e) The above effects may be obtained similarly in the case of using an etching gas other than the $Cl_2$ gas, in the case of using a precursor gas other than the MS gas, or in the case of using an inert gas other than the $N_2$ gas.

(4) Modifications

The present embodiments may be modified as in the following modifications. Further, these modifications may be arbitrarily combined. Unless otherwise specified, the processing procedures and processing conditions in each step of each modification are the same as the processing procedures and processing conditions in each step of the above-described substrate processing sequence.

(Modification 1)

In the etching step, step D may be performed after a cycle of performing the aforementioned steps A to C in the named order is performed a plurality of times. Also in this modification, the same effects as those of the substrate processing sequence shown in FIG. 4 may be obtained. Furthermore, according to this modification, even when the aspect ratio of the recess formed on the surface of the wafer 200 is, for example, 20 or more, i.e., even when the hollow portion is formed on the bottom side in the recess, it is easy to expose the hollow portion and to make the vertical sectional shape of the exposed hollow portion into a V-like shape or the like. As a result, in the second Si film-forming step, it is possible to more reliably fill the recess with the Si film.

(Modification 2)

As the etching gas, a hydrogen chloride (HCl) gas having lower reactivity than the $Cl_2$ gas may be used. In this case, the first temperature is set to a temperature falling within a range of, for example, 650 to 750 degrees C., and the second temperature is set to a temperature falling within a range of, for example, 500 to 550 degrees C. Furthermore, the HCl gas flows into the process chamber 201 while being diluted with an $N_2$ gas or a hydrogen ($H_2$) gas. Also in this modification, the same effects as those of the substrate processing sequence shown in FIG. 4 may be obtained.

However, the aforementioned technical problem, i.e., the reduction (deterioration) in the uniformity of the etching process, occurs particularly conspicuously when the $Cl_2$ gas or the like having high reactivity is used as the etching gas. Therefore, the technical significance of the etching process described in the present embodiments is particularly large when a highly reactive gas such as a $Cl_2$ gas or the like is used as the etching gas. In the case where the highly reactive gas such as a $Cl_2$ gas or the like is used as the etching gas, the etching step can be performed at a temperature at which the amorphous state of the first Si film is maintained. As a result, the above effects, i.e., the effects such as keeping the etching rate of the first Si film high and the like, may be reliably obtained.

(Modification 3)

In the first Si film-forming step, a PH gas may be supplied to the wafer 200 together with (simultaneously with) the MS gas. In this case, the first Si film is a Si film doped with P as a dopant (P-doped Si film). The supply flow rate of the PH gas is appropriately determined depending on the specifications of a device formed on the wafer 200 or the like, and may be set to a flow rate falling within a range of, for example, 0.1 to 500 sccm. Also in this modification, the same effects as those of the substrate processing sequence shown in FIG. 4 and the like may be obtained.

Other Embodiments

The embodiments of the present disclosure have been concretely described above. However, the present disclosure is not limited to the above-described embodiments and may be variously changed without departing from the spirit thereof.

In the above-described embodiments, there has been described an example in which a series of steps from the first Si film-forming step to the second Si film-forming step are performed in the same process chamber 201 (in-situ). However, the present disclosure is not limited to such embodiments. For example, the first Si film-forming step and the step group including the etching step and the subsequent steps may be performed in different process chambers (ex-situ). Furthermore, for example, the step group leading to the etching step and the second Si film-forming step may be performed ex-situ. Moreover, for example, the first and second Si film-forming steps and the etching step may be performed ex-situ. In addition, for example, the respective steps may be performed ex-situ. However, if all the steps are performed in-situ, the wafer 200 is not exposed to the air during the process, and the wafer 200 can be processed consistently while keeping the wafer 200 in a clean atmosphere. This makes it possible to stably perform a film-forming process.

The recipes used for the substrate processing are prepared separately according to the processing contents and are stored in the memory device 121c via an electric communication line or an external memory device 123. When starting the substrate processing, the CPU 121a properly selects an appropriate recipe from a plurality of recipes stored in the memory device 121c according to the contents of the substrate processing. This makes it possible to form films of various film types, composition ratios, film qualities and film thicknesses with high reproducibility in one substrate processing apparatus. In addition, the burden on an operator can be reduced, and the processing can be quickly started while avoiding operation errors.

The above-described recipes are not limited to the newly-prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided at the existing substrate processing apparatus may be operated to directly change the existing recipes already installed in the substrate processing apparatus.

In the above-described embodiments, there has been described an example in which a film is formed using a batch type substrate processing apparatus for processing a plurality of substrates at a time. The present disclosure is not limited to the above-described embodiments, but may be suitably applied to, for example, a case where a film is formed using a single-wafer type substrate processing apparatus for processing one or several substrates at a time. Furthermore, in the above-described embodiments, there has been described an example in which a film is formed using a substrate processing apparatus having a hot wall type process furnace. The present disclosure is not limited to the above-described embodiments, but may also be suitably applied to a case where a film is formed using a substrate processing apparatus having a cold wall type process furnace.

Even in the case of using these substrate processing apparatuses, film formation may be performed under the same processing procedures and processing conditions as those in the above-described embodiments and modifications, and the same effects as those of the above-described embodiments and modifications may be obtained.

In addition, the above-described embodiments and modifications may be used in combination as appropriate. The processing procedures and processing conditions at this time may be the same as, for example, the processing procedures and processing conditions of the above-described embodiments.

Examples

Examples will be described below.

As an Example, using the substrate processing apparatus shown in FIG. 1, a Si film formed on a surface of a wafer was etched under the same processing procedures and processing conditions as the processing procedures and processing conditions in the etching step of the above-described embodiments. A $Cl_2$ gas was used as an etching gas.

As a Comparative Example, using the substrate processing apparatus shown in FIG. 1, a Si film formed on a surface of a wafer was etched. A $Cl_2$ gas was used as an etching gas. The processing temperature was set to a constant temperature falling within a range of 300 to 400 degrees C. Other processing procedures and processing conditions were the same as the processing procedures and processing conditions in the Example.

As for the Example and the Comparative Example, the uniformity of the etching amount of the Si film in the wafer plane (WiW) and the uniformity of the etching amount of the Si film between the wafers (WtW) were measured, respectively. FIG. 6A is a view showing measurement results in the Example, and FIG. 6B is a view showing measurement results in the Comparative Example. In these figures, TOP, CEN and BTM indicate the positions of the wafers in the wafer arrangement region, i.e., the top, center and bottom positions of the wafers in the wafer arrangement region. WiW (±%) indicates the uniformity of the etching amount of the Si film in the wafer plane. The smaller the value of WiW, the better the uniformity of the etching amount in the wafer plane. WtW (□±%) indicates the uniformity of the etching amount of the Si film between the wafers. The smaller the value of WtW, the better the uniformity of the etching amount between the wafers.

According to FIGS. 6A and 6B, it can be noted that the value of WiW in the Example is smaller than the value of WiW in the Comparative Example. In addition, it can be noted that the value of WtW in the Example is smaller than the value of WtW in the Comparative Example. That is, the etching method (the method of the above-described embodiments) adopted in the Example is better in the uniformity of the etching amount in the wafer plane and the uniformity of the etching amount between the wafers than the etching method adopted in the Comparative Example. In the Comparative Example, it is considered that the etching amount in the outer peripheral portion of the wafer is larger than the etching amount in the central portion of the wafer and, as a result, the WiW is lower (more deteriorated) than that of the Example. Furthermore, in the Comparative Example, the etching process is progressed at the outer peripheral portion of the wafer on the upstream side of the gas flow. However, the progress of the etching process at the central portion of the wafer is suppressed. Therefore, the unreacted $Cl_2$ gas flows into and stays on the downstream side (BTM side) of the gas flow. As a result, it was considered that the etching process is excessively progressed on the BTM side, and the WtW is decreased (deteriorated).

According to the present disclosure in some embodiments, it is possible to improve the uniformity of an etching process in the plane of a substrate when etching a film formed on the surface of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    partially etching a first film formed on a surface of a substrate by performing a cycle a predetermined number of times, the cycle including:
    (a) setting a temperature of the substrate having the first film formed on the surface to a first temperature;
    (b) stabilizing an in-plane temperature of the substrate at the first temperature; and
    (c) lowering the temperature of the substrate having the in-plane temperature stabilized at the first temperature from the first temperature to a second temperature that is lower than the first temperature,
    wherein in (c), an etching gas is supplied to the substrate for a predetermined period while lowering the temperature of the substrate to the second temperature, and
    wherein in (c), after starting lowering the temperature of the substrate and before the temperature of the substrate reaches the second temperature, a supply of the etching gas is started after a temperature of an outer peripheral portion of the substrate becomes lower than a temperature of a central portion of the substrate.

2. The method of claim 1, wherein in (c), before the temperature of the outer peripheral portion of the substrate becomes lower than the temperature of the central portion of the substrate, the supply of the etching gas is not carried out.

3. A method of manufacturing a semiconductor device, comprising:
    partially etching a first film formed on a surface of a substrate by performing a cycle a predetermined number of times, the cycle including:
    (a) setting a temperature of the substrate having the first film formed on the surface to a first temperature;
    (b) stabilizing an in-plane temperature of the substrate at the first temperature; and (c) lowering the temperature of the substrate having the in-plane temperature stabilized at the first temperature from the first temperature to a second temperature that is lower than the first temperature, wherein in (c), an etching gas is supplied to the substrate for a predetermined period while lowering the temperature of the substrate to the second temperature, and wherein in (c), after starting lowering the temperature of the substrate and before the temperature of the substrate reaches the second temperature, a supply of the etching gas is started after a temperature difference between an outer peripheral portion of the substrate and a central portion of the substrate becomes a predetermined temperature difference.

4. The method of claim 3, wherein the predetermined temperature difference is 1 degrees C. or higher and 10 degrees C. or lower.

5. The method of claim 3, wherein in (c), before the temperature difference between the outer peripheral portion of the substrate and the central portion of the substrate becomes the predetermined temperature difference, the supply of the etching gas is not carried out.

6. The method of claim 3, wherein in (c), when the temperature difference between the outer peripheral portion of the substrate and the central portion of the substrate is not the predetermined temperature difference, the supply of the etching gas is not carried out.

7. The method of claim 1, wherein the etching gas flows from a side portion of the substrate toward the central portion of the substrate.

8. The method of claim 1, wherein the etching gas comes into contact with a central portion of the first film after making contact with an outer peripheral portion of the first film.

9. The method of claim 1, further comprising forming the first film so as to fill a recess formed on the surface of the substrate before partially etching the first film.

10. The method of claim 9, further comprising forming a second film on the partially-etched first film after partially etching the first film.

11. The method of claim 10, wherein the act of partially etching the first film is performed in a process chamber different from a process chamber in which the act of forming the first film and the act of forming the second film are performed.

12. The method of claim 10, wherein the act of forming the first film, the act of partially etching the first film, and the act of forming the second film are performed in the same process chamber.

13. The method of claim 10, wherein the act of forming the first film, the act of partially etching the first film, and the act of forming the second film are performed at a temperature of 550 degrees C. or lower.

14. The method of claim 10, wherein the act of forming the first film, the act of partially etching the first film, and the act of forming the second film are performed at a temperature equal to or lower than a crystallization temperature of the first film.

15. The method of claim 10, wherein the act of forming the first film, the act of partially etching the first film, and the act of forming the second film are performed at a temperature equal to or lower than a critical temperature at which a crystalline state of the first film shifts from an amorphous state to a polycrystalline state.

16. The method of claim 10, wherein in the act of forming the first film, a non-doped silicon film is formed as the first film, and in the act of forming the second film, a non-doped silicon film or a dopant-doped silicon film is formed as the second film.

17. The method of claim 10, wherein in the act of forming the first film, a dopant-doped silicon film is formed as the first film, and in the act of forming the second film, a non-doped silicon film or a dopant-doped silicon film is formed as the second film.

\* \* \* \* \*